(12) United States Patent
Kamineni et al.

(10) Patent No.: US 9,123,787 B2
(45) Date of Patent: Sep. 1, 2015

(54) THROUGH-SILICON VIA UNIT CELL WITH KEEP OUT ZONES AND CENTER POINT ALIGNED PROBE PAD, AND METHOD OF FORMING

(71) Applicant: GLOBALFOUNDRIES Inc., Grand Cayman (KY)

(72) Inventors: Himani S. Kamineni, Albany, NY (US); Ramakanth Alapati, Rexford, NY (US); Maria Balicka, San Jose, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/028,729

(22) Filed: Sep. 17, 2013

(65) Prior Publication Data

US 2015/0076706 A1    Mar. 19, 2015

(51) Int. Cl.
*H01L 21/768* (2006.01)
*H01L 23/498* (2006.01)
*G06F 17/50* (2006.01)

(52) U.S. Cl.
CPC ...... *H01L 21/76897* (2013.01); *G06F 17/5077* (2013.01); *H01L 23/49827* (2013.01)

(58) Field of Classification Search
CPC ..................................................... H01L 23/498
See application file for complete search history.

(56) References Cited

U.S. PATENT DOCUMENTS

| | | | |
|---|---|---|---|
| 7,466,028 B1 * | 12/2008 | Yu et al. | 257/774 |
| 8,338,939 B2 | 12/2012 | Lin et al. | |
| 2010/0148316 A1 | 6/2010 | Kim et al. | |
| 2013/0024737 A1 | 1/2013 | Marinissen et al. | |

* cited by examiner

*Primary Examiner* — Marc Armand
*Assistant Examiner* — Younes Boulghassoul
(74) *Attorney, Agent, or Firm* — Williams Morgan, P.C.

(57) ABSTRACT

Exemplary embodiments of the present invention provide a V0 via unit cell with multiple keep out zones. The keep out zones are oriented concentrically and provide support for multiple sizes of through-silicon vias (TSVs). An off-center alignment between the V0 via unit cell and a probe pad is used to improve contact between the V0 vias and a probe pad. During a chip redesign, the TSV size may be changed without the need to revise the V0 mask.

11 Claims, 10 Drawing Sheets

… (1)

THROUGH-SILICON VIA UNIT CELL WITH KEEP OUT ZONES AND CENTER POINT ALIGNED PROBE PAD, AND METHOD OF FORMING

FIELD OF THE INVENTION

The present invention relates generally to semiconductors, and more particularly, to a through-silicon via unit cell.

BACKGROUND

Electronic design automation (EDA) tools are computer-based tools that assist through automation of procedures that would otherwise be performed manually. Simulation of proposed design functionality and synthesis of integrated circuit logic and layout are two examples.

An integrated circuit may implement logic functions and other connectivity features that are a combination of various unit cells. Steps in completing the circuit design typically include placement of devices and features, routing, and electronic simulations.

The semiconductor industry is increasingly developing 3D integration chips utilizing stacked wafers based on through-silicon vias (TSVs). TSVs are conducting metal lines which extend out of the back side of a thinned-down die and enable the vertical interconnect to another die. EDA tools are a key part of developing such complex chips. TSVs are high-density, low-capacity interconnects compared to traditional wire bonds, and hence allow for many more interconnections between stacked dies, while operating at higher speeds and consuming less power. TSV-based 3D technologies enable the creation of a new generation of chips by opening up new architectural opportunities. Combined with their smaller form factor and lower overall manufacturing cost, 3D integration chips have many compelling benefits, and hence their technology is rapidly being developed. TSVs are an integral part of the 3D chip design and fabrication. Therefore, it is desirable to have improvements relating to the use of TSVs within 3D chip design and fabrication processes.

SUMMARY

In a first aspect, embodiments of the present invention provide a semiconductor structure comprising: a semiconductor substrate; a through-silicon via (TSV) disposed within the semiconductor substrate; and a plurality of V0 vias disposed on the TSV, wherein the plurality of V0 vias comprise a V0 unit cell, and wherein the V0 unit cell comprises at least two keep out zones.

In a second aspect, embodiments of the present invention provide a computer program product embodied in a non-transitory computer-readable medium for designing an integrated circuit, comprising: instructions for generating a unit cell, the unit cell comprising coordinate data for a plurality of V0 vias, wherein the plurality of V0 vias are arranged to form at least two keep out zones.

In a third aspect, embodiments of the present invention provide a method of forming a semiconductor structure, comprising: forming a through-silicon via (TSV) in a semiconductor substrate; and forming a plurality of V0 vias disposed on the TSV, wherein the plurality of V0 vias comprise a V0 unit cell, and wherein the V0 unit cell comprises at least two keep out zones.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments of the present invention provide a V0 via unit cell with multiple keep out zones. The keep out zones are oriented concentrically and provide support for multiple sizes of through-silicon vias (TSVs). An off-center alignment between the V0 via unit cell and a probe pad is used to improve contact between the V0 vias and a probe pad. During a chip redesign, the TSV size may be changed without the need to revise the V0 mask, saving considerable costs and time.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1A:
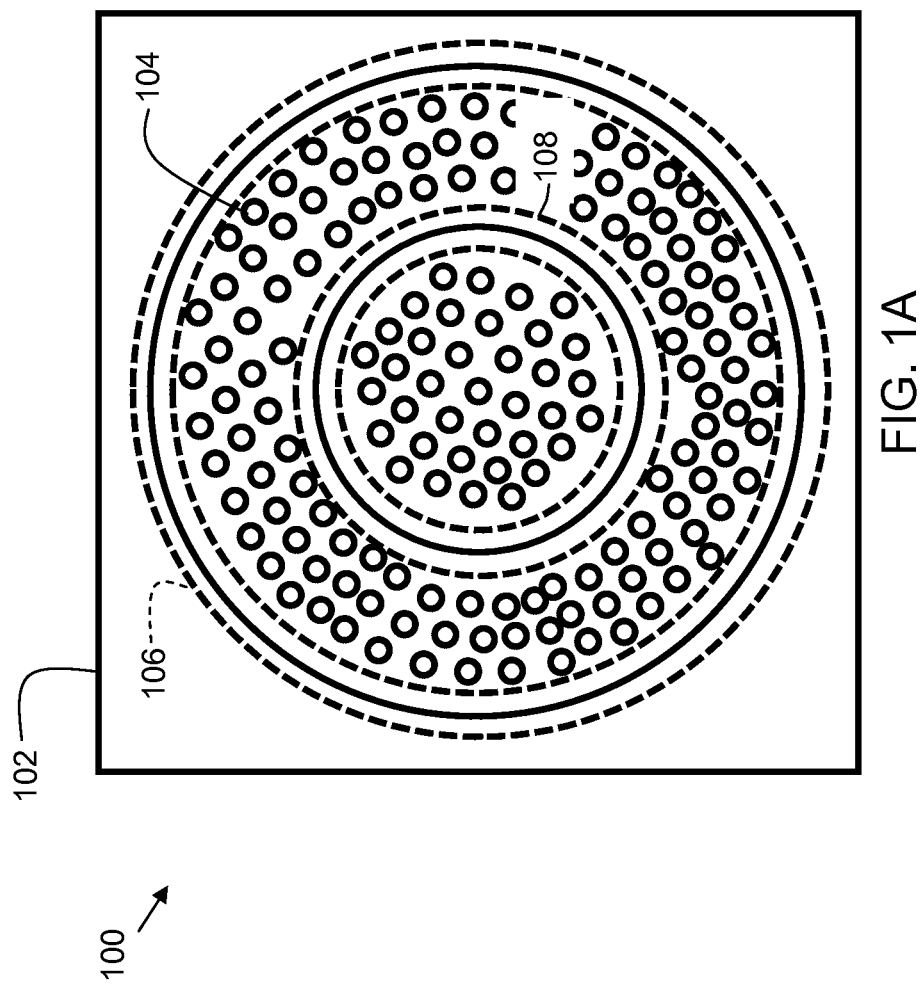
FIG. 1A and FIG. 1B show an embodiment of a V0 unit cell in accordance with illustrative embodiments.
Figure 1B:
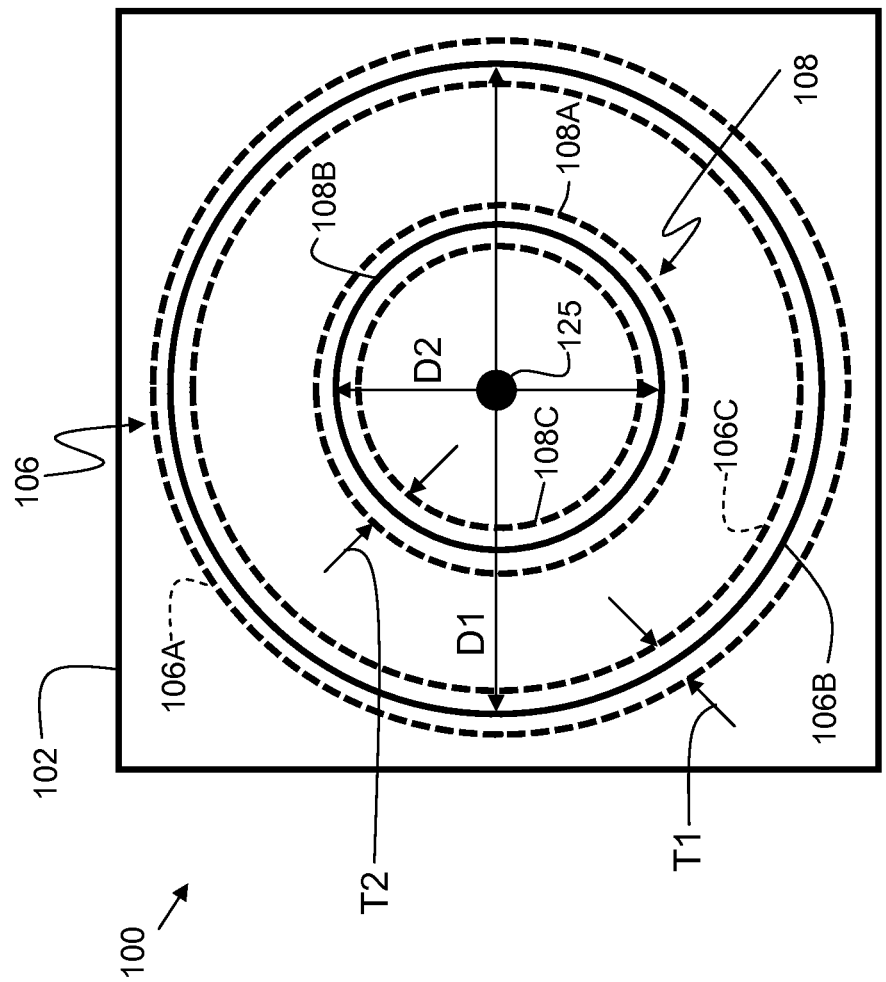

FIG. 1A and FIG. 1B show an embodiment of a V0 unit cell 100 in accordance with illustrative embodiments. Unit cell 100 may include a definition of an outer boundary 102. Within the boundary 102, a plurality of vias, indicated generally as 104, are defined. During fabrication, vias are formed using lithographic methods involving a mask. V0 vias represent the back-end-of-line (BEOL) interface to metallization layer M1, middle-of-line (MOL) and the TSVs. A V0 mask is used in formation of the V0 via layer in a semiconductor integrated circuit. The V0 mask typically has fairly small features (on the order of nanometers), which makes it an expensive mask. In contrast, a through-silicon via (TSV) is a fairly large feature (on the order of micrometers). Hence, a TSV mask is typically much cheaper than a V0 mask. In some cases, a V0 mask may be 10 to 15 times the cost of a TSV mask. Embodiments of the present invention provide a V0 mask that can accommodate multiple sizes of TSVs. When a V0 layer is connected to a TSV, a keep out zone (KOZ) is established around the circumference of the TSV. No vias are present in the keep out zone. This is to prevent any vias from damaging the liner that surrounds a TSV to provide isolation and prevent diffusion of the TSV conductor metal. FIG. 1A shows a first KOZ 106 and a second KOZ 108. Vias 104 are formed outside of the keep out zones. FIG. 1B shows the V0 unit cell 100, but in FIG. 1B, the vias are not shown for the sake of illustrating other key features of the V0 unit cell 100. Center point 125 represents the center of the V0 unit cell 100. The first keep out zone 106 comprises an outer perimeter 106A, a middle perimeter 106B, and an inner perimeter 106C. Ideally, a TSV is aligned to the middle perimeter 106B, and the outer perimeter 106A and inner perimeter 106B provide a safety margin where no V0 vias are present. First keep out zone 106 has a thickness T1, which is the distance between the outer perimeter 106A and the inner perimeter 106C. In some embodiments, thickness T1 may range from about 0.8 micrometers to about 1.2 micrometers. KOZ 106 has a diameter D1, which represents a large-sized TSV. In some embodiments, D1 may be about six micrometers.

Second keep out zone 108 accommodates a small-sized TSV. KOZ 108 has a diameter D2. In some embodiments, D2 may be about three micrometers. KOZ 108 has a thickness T2, which is the distance between the outer perimeter 108A and the inner perimeter 108C. In some embodiments, thickness T2 may range from about 0.8 micrometers to about 1.2 micrometers. In some embodiments, T2 may be equal to T1. In other embodiments, T2 may be unequal to T1. In some embodiments, T2 is smaller than T1. In some embodiments, thickness T1 may range from about 0.8 micrometers to about 1.2 micrometers, and thickness T2 may range from about 0.6 micrometers to about 0.9 micrometers. In some embodiments, diameter D1 may be two times the diameter D2. Furthermore, while some embodiments may have circular keep out zones, other embodiments may have keep out zones of other polygon shapes, such as squares and rectangles, for example. The shape of the keep out zone depends upon the shape of the TSV. For example, a circular TSV uses a circular keep out zone, and a square TSV uses a square keep out zone.

Figure 2A:
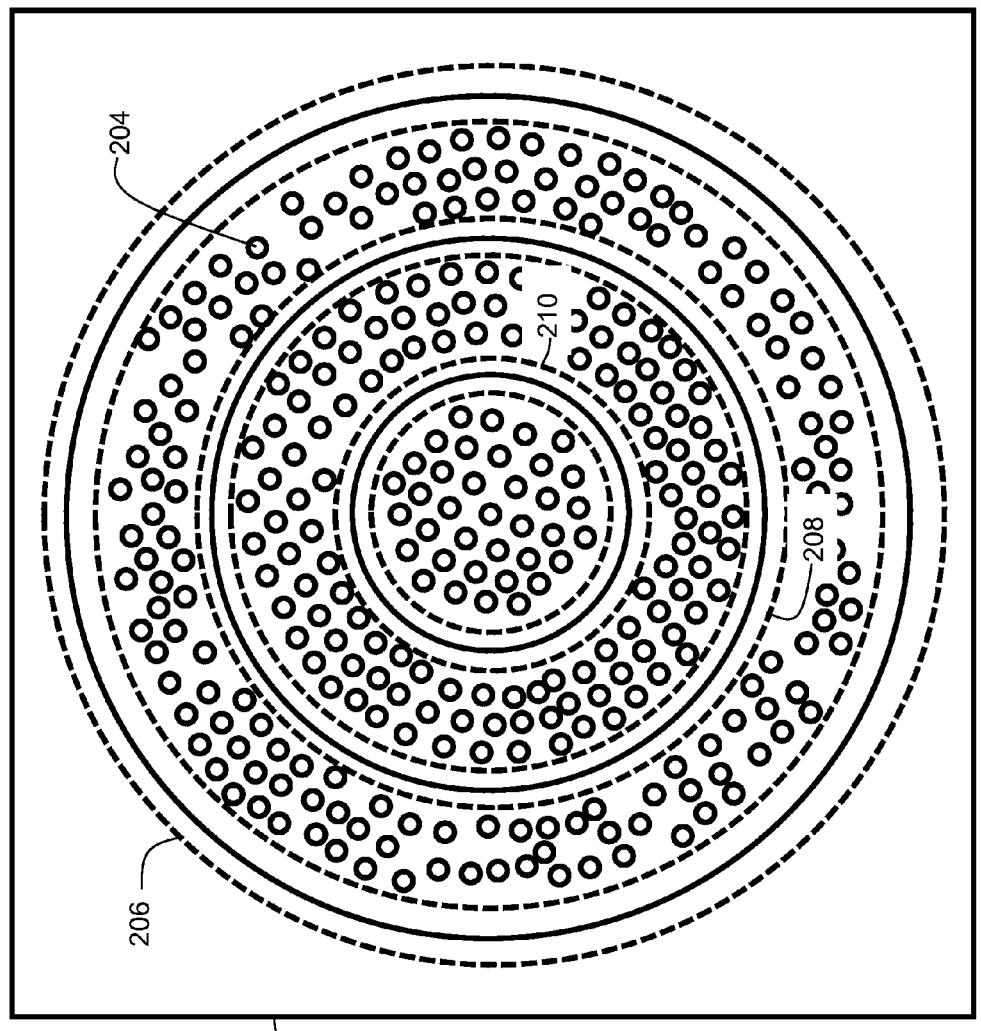
FIG. 2A and FIG. 2B show an embodiment of a V0 unit cell in accordance with alternative illustrative embodiments.
Figure 2B:
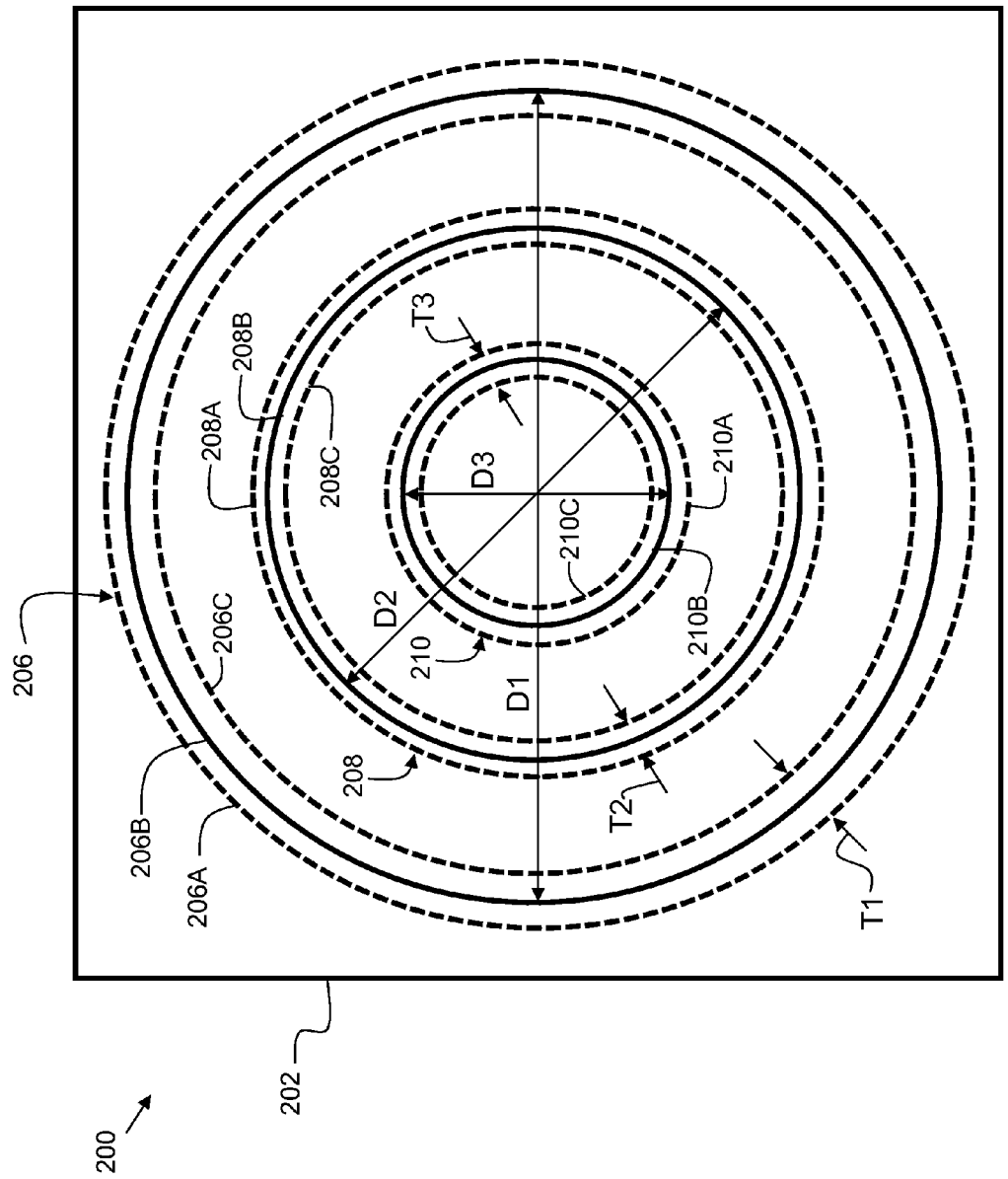

FIG. 2A and FIG. 2B show an embodiment of a V0 unit cell 200 in accordance with alternative illustrative embodiments. Unit cell 200 may include a definition of an outer boundary 202. Within the boundary 202, a plurality of vias, indicated generally as 204, are defined. V0 unit cell 200 defines three keep out zones (KOZ). KOZ 206 is a large-sized keep out zone. KOZ 208 is a medium-sized keep out zone. KOZ 210 is a small-sized keep out zone. Embodiments are not limited to three keep out zones, and some embodiments may have more than three keep out zones. FIG. 2B shows the V0 unit cell 200, but in FIG. 2B, the vias are not shown for the sake of illustrating other key features of the V0 unit cell 200. In particular, the first keep out zone 206 comprises an outer perimeter 206A, a middle perimeter 206B, and an inner perimeter 206C. First keep out zone 206 has a thickness T1, which is the distance between the outer perimeter 206A and the inner perimeter 206C. In some embodiments, thickness T1 may range from about 0.8 micrometers to about 1.2 micrometers. KOZ 206 has a diameter D1, which represents a large-sized TSV. In some embodiments, D1 may be about six micrometers. Second keep out zone 208 has a thickness T2, which is the distance between the outer perimeter 208A and the inner perimeter 208C. In some embodiments, thickness T2 may range from about 0.8 micrometers to about 1.2 micrometers. KOZ 208 has a diameter D2, which represents a medium-sized TSV. In some embodiments, D2 may be about four micrometers. Third keep out zone 210 has a thickness T3, which is the distance between the outer perimeter 210A and the inner perimeter 210C. In some embodiments, thickness T3 may range from about 0.8 micrometers to about 1.2 micrometers. KOZ 210 has a diameter D3, which represents a small-sized TSV. In some embodiments, D3 may be about two micrometers. In some embodiments, T1, T2, and T3 may be equal to each other. In some embodiments, T1, T2, and T3 may be of different sizes. For example, in some embodiments, T1 may be about 1.0 micrometers, T2 may be about 0.8 micrometers, and T3 may be about 0.7 micrometers. In embodiments, the keep out zones 206, 208 and 210 may be arranged concentrically.

Figure 3B:
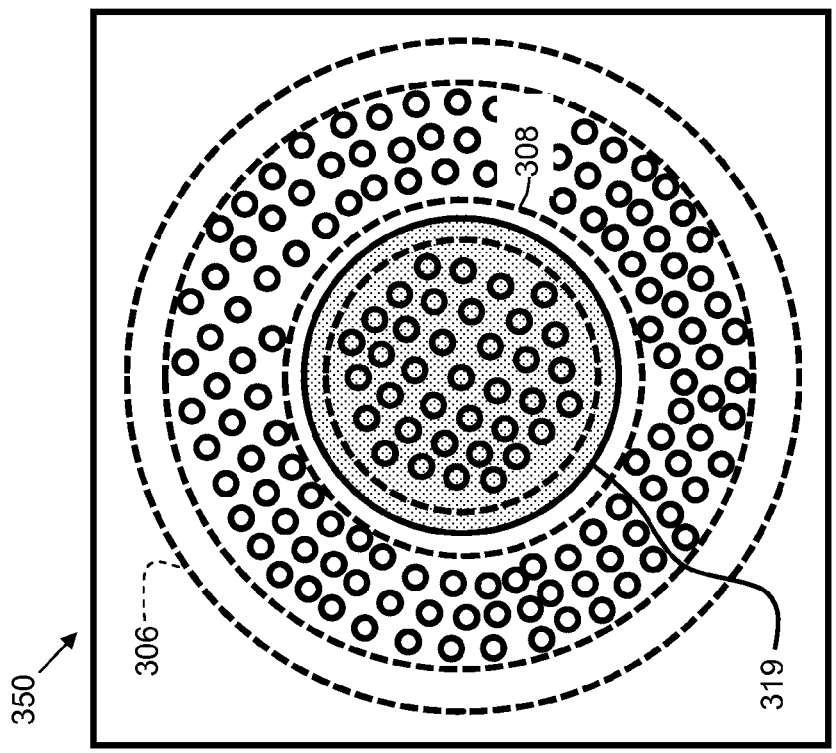
FIG. 3B shows an embodiment of a V0 unit cell in use with a small-sized TSV in accordance with illustrative embodiments.
Figure 3A:
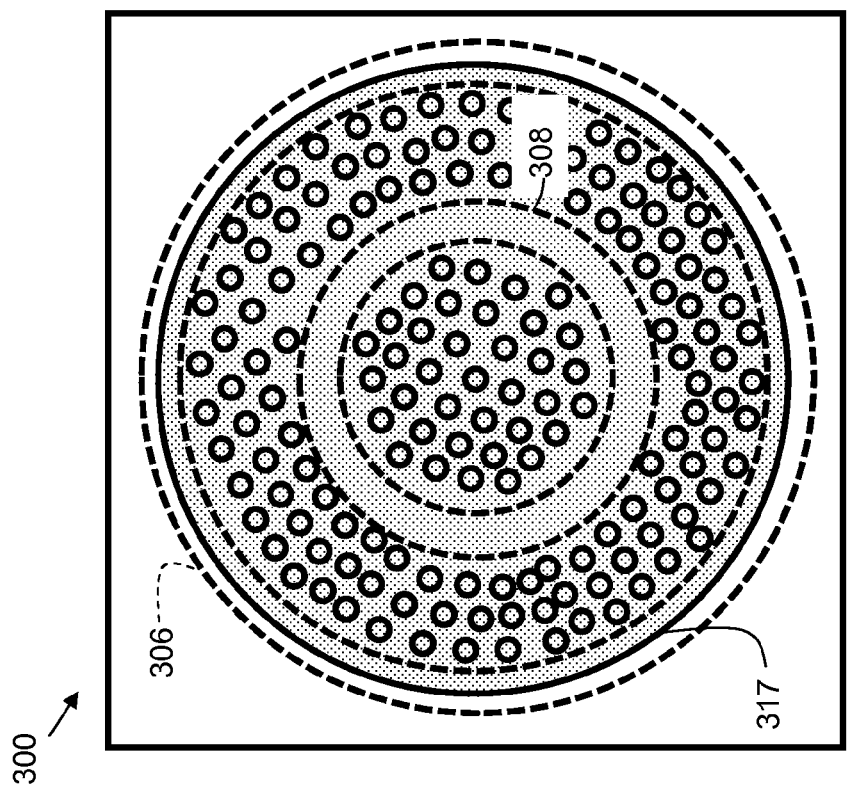
FIG. 3A shows an embodiment of a V0 unit cell in use with a large-sized TSV in accordance with illustrative embodiments.

FIG. 3A shows an embodiment of a unit cell 300 in use with a large-sized TSV 317 in accordance with illustrative embodiments. Large-sized TSV 317 is centered within the via pattern such that it aligns with keep out zone 306. Similarly, FIG. 3B shows an embodiment of a unit cell 350 in use with a small-sized TSV 319 in accordance with illustrative embodiments. Small-sized TSV 319 is centered within the via pattern such that it aligns with keep out zone 308. Advantages of embodiments of the present invention can now be easily appreciated. For example, consider the case of a redesign of an integrated circuit, where the revised design reduces the size of TSVs from six micrometers to three micrometers. Prior to embodiments of the present invention, both the TSV mask and the V0 mask would need to change. With embodiments of the present invention, the novel V0 pattern includes multiple keep out zones, such that a variety of TSV sizes are accommodated with a single V0 mask. Hence, the TSV size of a chip can be changed without incurring the cost of a new V0 mask, resulting in considerable savings of both cost and time.

Figure 4:
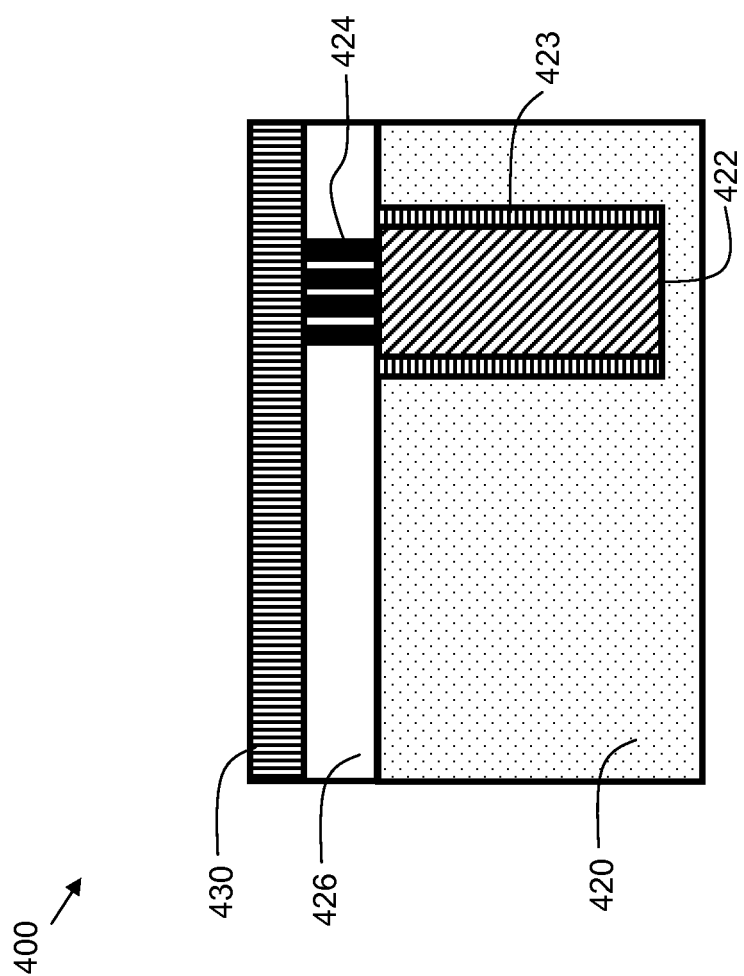
FIG. 4 shows a side view of a semiconductor structure in accordance with illustrative embodiments.

FIG. 4 shows a side view of a semiconductor structure 400 in accordance with illustrative embodiments. Semiconductor structure 400 comprises a semiconductor substrate 420, which may comprise a silicon substrate, such as a silicon wafer. TSV 422 is formed within semiconductor substrate 420. A liner 423 is disposed around TSV 422. The liner 423 may include a dielectric (oxide/nitride) layer, as well as one or more barrier materials, such as tantalum or titanium based materials. The liner 423 serves to isolate the TSV from the substrate 420, and also prevents diffusion of atoms of the conductor metal of TSV 422, which may be copper or tungsten in some embodiments. Disposed on, and in direct physical contact with TSV 422, is via layer 426, which includes a plurality of V0 vias, indicated generally as 424. The vias 424 are formed on the TSV 422, but are not formed on the liner 423, to avoid damage of the liner. Disposed on, and in direct physical contact with V0 vias 424, is metallization layer M1, indicated as 430. Additional via layers and metallization layers (not shown) may exist above M1.

Figure 5A:
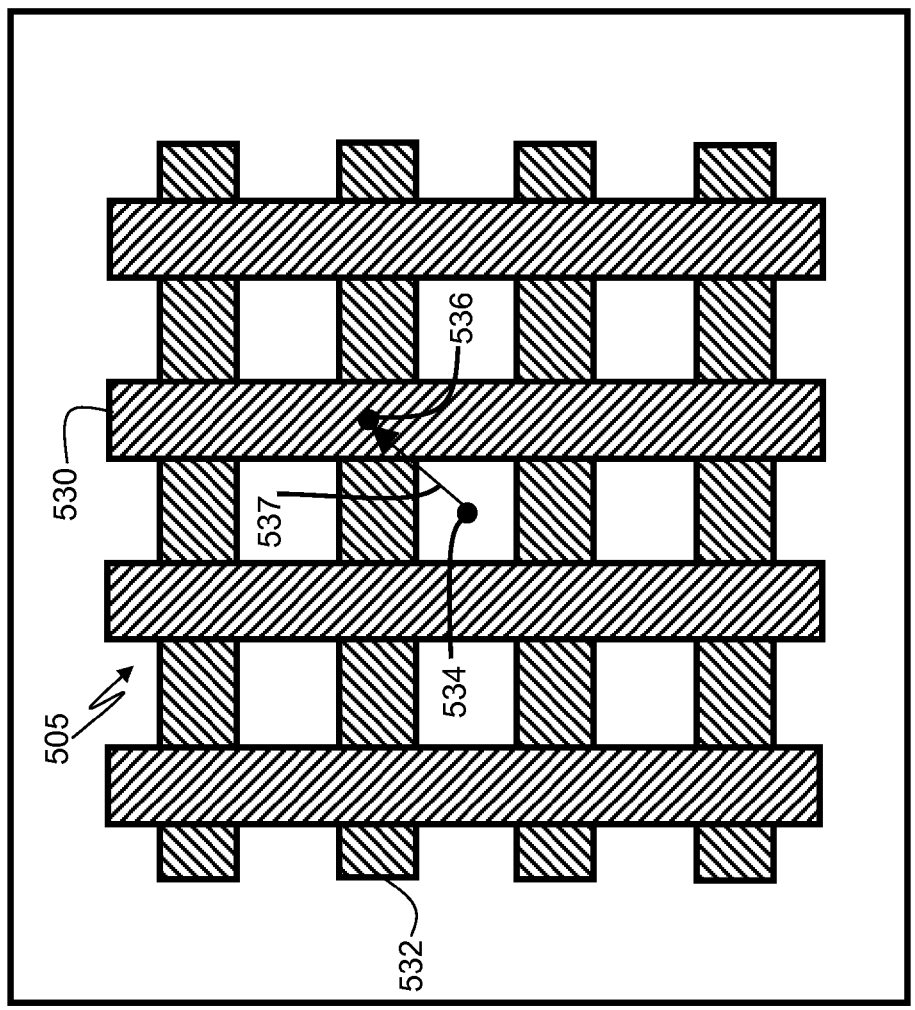
FIG. 5A and FIG. 5B show a top-down view of a semiconductor structure in accordance with alternative illustrative embodiments.
Figure 5B:
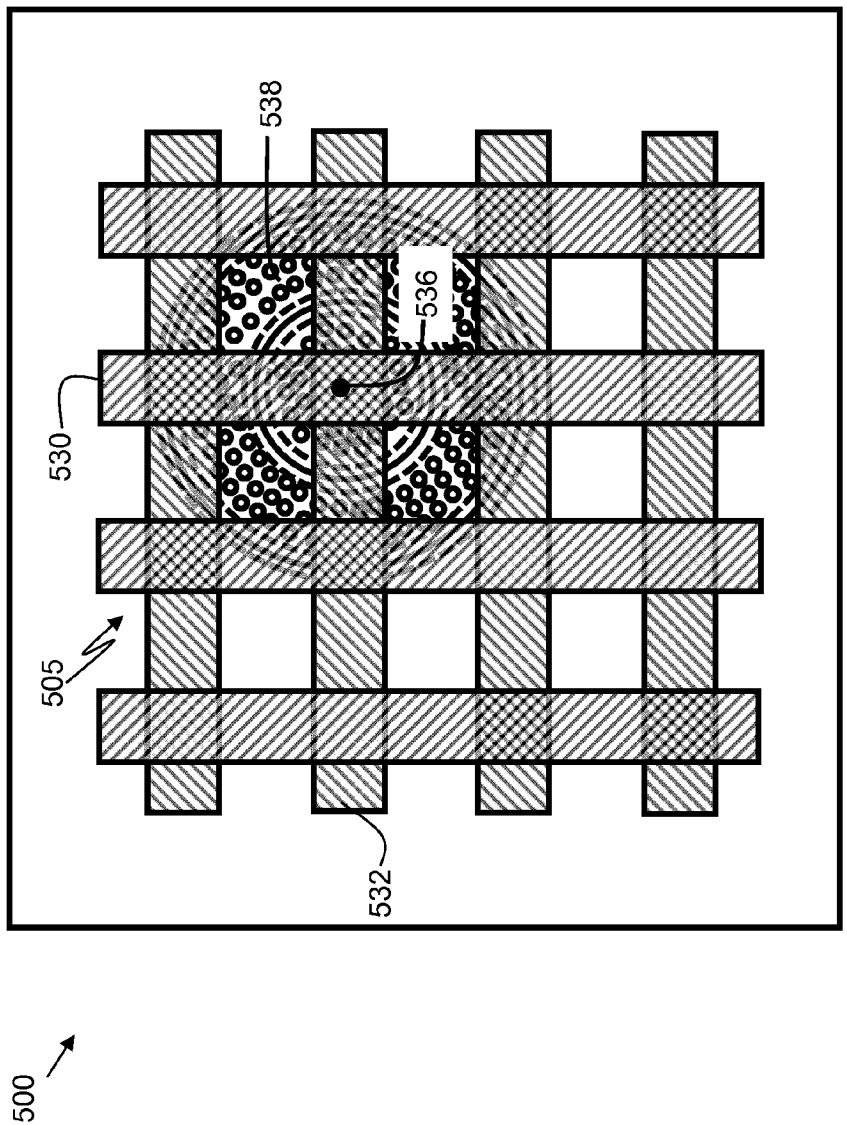

FIG. 5A and FIG. 5B show a top-down view of a semiconductor structure 500 in accordance with alternative illustrative embodiments. FIG. 5A shows a probe pad 505, which comprises a plurality of vertical M1 lines, indicated generally as 530, and a plurality of horizontal M1 lines, indicated generally as 532. The vertical M1 lines 530 are oriented perpendicularly to the horizontal M1 lines 532. The probe pad 505 may be used to perform electrical measurements, such as for device testing. Point 534 represents the center of probe pad 505. In prior art implementations, a TSV is aligned with center point 534. However, with the novel V0 via pattern of embodiments of the present invention, an off-center placement provides improved conductivity. Point 536 represents the intersection of a vertical M1 line 530 and a horizontal M1 line 532. FIG. 5B shows probe pad 505 with a V0 unit cell 538 disposed below it, and a center point of the V0 unit cell is aligned with point 536. Hence, the center point of the V0 cell is not aligned at the center 534 of the probe pad. Instead, a shift 537 is applied (as indicated by arrow 537 pointing to point 536), so that the center point of the V0 cell is aligned at point 536, which is an intersection of one of the horizontal M1 lines 532 and one of the vertical M1 lines 530. In this way, contact between the probe pad 505 and the V0 unit cell 538 is increased compared with prior art methods, resulting in lower resistance and improved performance of an integrated circuit utilizing these TSVs. V0 unit cell 538 may be similar to the unit cell illustrated in FIGS. 1A and 1B.

Figure 6:
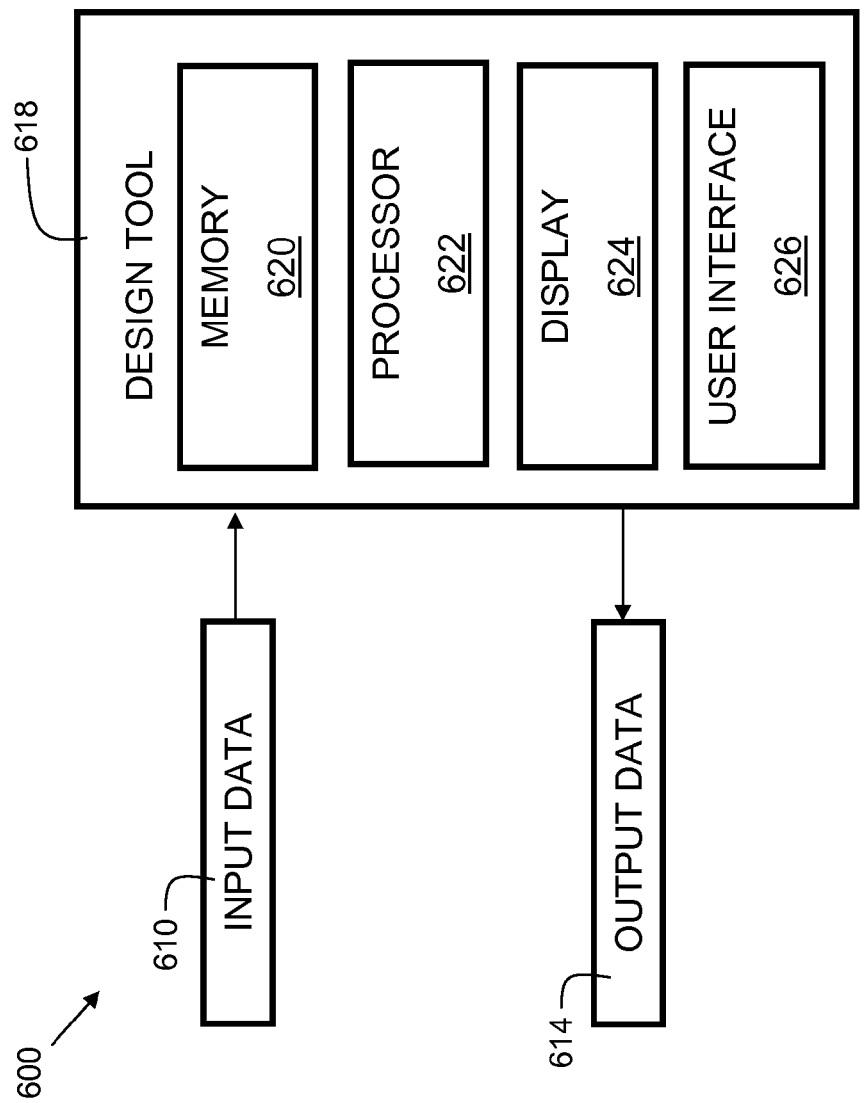
FIG. 6 shows a system in accordance with illustrative embodiments.

FIG. 6 is a system for implementing illustrative embodiments. System 600 includes a design tool 618. Design tool 618 may be a computer comprising memory 620, and a processor 622 which is coupled to memory 620, such that the processor 622 may be configured to read and write memory 620. In some embodiments, multiple processors or cores may be used. The memory 620 may be a non-transitory computer-readable medium, such as flash, ROM, non-volatile static ram, or other non-transitory memory. The memory 620 contains instructions that, when executed by processor 622, control the various subsystems to operate system 600. Design tool 618 may also include a display 624 and a user interface 626 for interacting with the system 600. The user interface 626 may include a keyboard, touch screen, mouse, or the like.

The design tool 618 may receive input data 610. Input data 610 may include a design structure, which may include a V0 unit cell, wherein the V0 unit cell comprises at least two keep out zones. Additionally, the design structure may include a probe pad unit cell, which includes a TSV, a V0 unit cell, and a probe pad, wherein the probe pad comprises a first set of metal lines and a second set of metal lines, wherein the first set of metal lines is oriented perpendicularly to the second set of metal lines, forming a plurality of metal line intersections, and wherein one metal line intersection of the plurality of metal line intersections is aligned with a center point of the V0 unit cell. The design structure may include coordinate data for the probe pad, TSV, and each via of the V0 unit cell. The coordinate data may include position and size information for the various structures such as the probe pad, TSV, and each via of the V0 unit cell. The design structure may be a logical simulation design structure generated and processed by a design process to produce a logically equivalent functional representation of a hardware device. The design structure may also, or alternatively, include data and/or program instructions that when processed by design tool 618, generate a functional representation of the physical structure of a hardware device. The input data 610 may include hardware-description language (HDL) design entities or other data structures conforming to and/or compatible with lower-level HDL design languages such as Verilog and VHDL, and/or higher level design languages such as C, C++, or Python. Embodiments of the present invention may further include a computer program product embodied in a non-transitory computer-readable medium.

The design tool 618 may generate output data 614. The generated output data 614 may be in a stream format indicative of a V0 unit cell, wherein the V0 unit cell comprises at least two keep out zones. Additionally, the generated output data 614 may include a probe pad unit cell, which includes a TSV, a V0 unit cell, and a probe pad, wherein the probe pad comprises a first set of metal lines and a second set of metal lines, wherein the first set of metal lines is oriented perpendicularly to the second set of metal lines, forming a plurality of metal line intersections, and wherein one metal line intersection of the plurality of metal line intersections is aligned with a center point of the V0 unit cell. The output data may reside in a storage medium in a data format used for the exchange of layout data of integrated circuits (e.g. information stored in a GDSII (GDS2), GL1, OASIS, or any other suitable format for storing such design structures). Output data 614 may include information such as, for example, parameterized cells, test data files, design content files, manufacturing data, layout parameters, wires, back end of line (BEOL) interconnect information, net lists, levels of metal, vias, shapes, data for routing through the manufacturing line, and any other data required by a semiconductor manufacturer to produce embodiments of the present invention.

Figure 7:
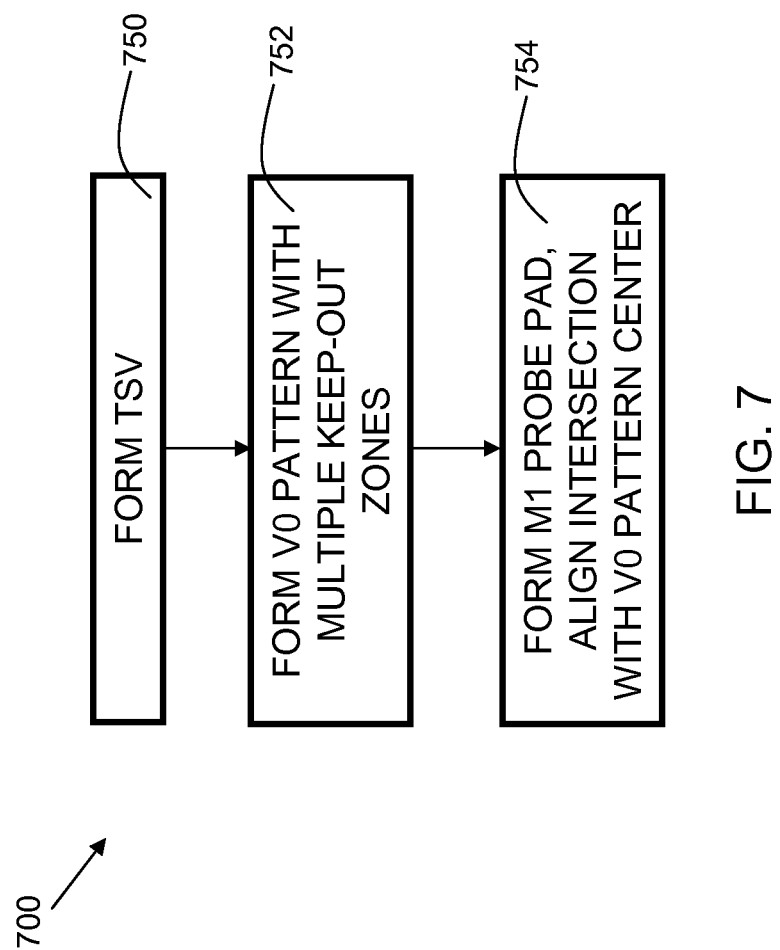
FIG. 7 is a flowchart indicating process steps for illustrative embodiments.

FIG. 7 is a flowchart 700 indicating process steps for illustrative embodiments. In process step 750, a TSV is formed. In process step 752, a V0 pattern of vias (unit cell) is formed with multiple keep out zones, such as is indicated in FIGS. 1-2. In process step 754, a layer 1 (M1) metal probe pad is formed, and aligned with the V0 pattern at an intersection of perpendicular lines of the probe pad, as indicated in FIG. 5B.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
   a semiconductor substrate;
   a through-silicon via (TSV) disposed within the semiconductor substrate;
   a plurality of V0 vias disposed on the TSV, wherein the plurality of V0 vias comprise a V0 unit cell, and wherein the V0 unit cell comprises at least two keep out zones; and
   a probe pad disposed on the V0 unit cell, wherein the probe pad comprises a first set of metal lines and a second set of metal lines, wherein the first set of metal lines is oriented perpendicularly to the second set of metal lines, forming a plurality of metal line intersections, and wherein one metal line intersection of the plurality of metal line intersections is aligned with a center point of the V0 unit cell.

2. The structure of claim 1, wherein the at least two keep out zones are circular.

3. The structure of claim 1, wherein each of the at least two keep out zones has a thickness ranging from about 0.8 micrometers to about 1.2 micrometers.

4. The structure of claim 2, wherein a first keep out zone of the at least two keep out zones has a diameter of two times a diameter of a second keep out zone of the at least two keep out zones.

5. The structure of claim 4, wherein the first keep out zone has a diameter of about six micrometers and the second keep out zone has a diameter of about three micrometers.

6. The structure of claim 2, wherein the at least two keep out zones comprise a first keep out zone, a second keep out zone, and a third keep out zone.

7. The structure of claim 6, wherein the first keep out zone, second keep out zone, and third keep out zone are arranged concentrically.

8. The structure of claim 7, wherein the first keep out zone has a diameter of about 6 micrometers, the second keep out zone has a diameter of about 3 micrometers, and the third keep out zone has a diameter of about 1 micrometer.

9. A method of forming a semiconductor structure, comprising:
   forming a through-silicon via (TSV) in a semiconductor substrate;
   forming a plurality of V0 vias disposed on the TSV, wherein the plurality of V0 vias comprise a V0 unit cell, and wherein the V0 unit cell comprises at least two keep out zones; and,
   forming a probe pad disposed on, and in direct physical contact with the V0 unit cell, wherein the probe pad comprises a first set of metal lines and a second set of metal lines, wherein the first set of metal lines is oriented perpendicularly to the second set of metal lines, forming a plurality of metal line intersections, and wherein one metal line intersection of the plurality of metal line intersections is aligned with a center point of the V0 unit cell.

10. The method of claim 9, wherein forming a plurality of V0 vias comprises forming a first keep out zone, a second keep out zone, and a third keep out zone.

11. The method of claim 9, wherein forming the at least two keep out zones comprises forming circular keep out zones.

* * * * *